(12) United States Patent
Clark et al.

(10) Patent No.: US 8,686,556 B2
(45) Date of Patent: Apr. 1, 2014

(54) WAFER LEVEL APPLIED THERMAL HEAT SINK

(71) Applicant: Flipchip International, LLC, Phoenix, AZ (US)

(72) Inventors: David Clark, Ipswich (GB); Theodore G. Tessier, Chandler, AZ (US)

(73) Assignee: FlipChip International, LLC, Phoenix, AZ (US)

( * ) Notice: Subject to any disclaimer, the term of this patent is extended or adjusted under 35 U.S.C. 154(b) by 0 days.

(21) Appl. No.: 13/644,579

(22) Filed: Oct. 4, 2012

(65) Prior Publication Data

US 2013/0087904 A1    Apr. 11, 2013

Related U.S. Application Data

(60) Provisional application No. 61/543,472, filed on Oct. 5, 2011.

(51) Int. Cl.
    *H01L 21/56*        (2006.01)
(52) U.S. Cl.
    USPC ............ 257/707; 257/706; 257/782; 257/783
(58) Field of Classification Search
    USPC ........... 257/783, E23.109; 438/106, 113, 118
    See application file for complete search history.

(56) References Cited

U.S. PATENT DOCUMENTS

| | | |
|---|---|---|
| 6,326,678 B1 | 12/2001 | Karnezos et al. |
| 6,916,688 B1 | 7/2005 | Kelkar et al. |
| 7,939,368 B2 | 5/2011 | Chow et al. |
| 2002/0173077 A1 | 11/2002 | Ho et al. |
| 2007/0212812 A1 | 9/2007 | Chow et al. |
| 2011/0031602 A1* | 2/2011 | Wowra et al. ................. 257/690 |
| 2011/0037155 A1 | 2/2011 | Pagaila |

OTHER PUBLICATIONS

WIPO Search Report and Written Opinion dated Feb. 28, 2013 for corresponding Application No. PCT/US2012/058836; 9 sheets.

* cited by examiner

*Primary Examiner* — Dung A. Le
(74) *Attorney, Agent, or Firm* — Greenberg Traurig, LLP

(57) ABSTRACT

A process for forming a heat sink on a semiconductor package at the wafer level stage of manufacture is disclosed. A semiconductor component wafer, prior to separation into separate component packages, is covered on one side with a resin metal foil layer. The resin foil layer is patterned by laser ablation to define the heat sink locations, and then a thermal paste is applied over the patterned layer. The thermal conductive paste is hardened to form the heat sinks. The wafer can then be separated into packages.

16 Claims, 5 Drawing Sheets

1. INCOMING
2. Ti/Cu SEED LAYER DEPOSITION BY PVD
3. PLATING PHOTORESIST APPLICATION AND PATTERN
4. Cu ELECTROPLATING
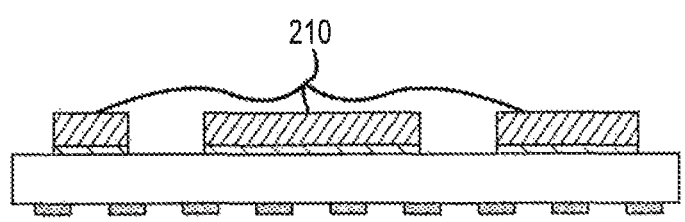
5. RESIST STRIP AND SEED LAYER ETCH
CONVENTIONAL
FIG.2E

INCOMING

RESIN COPPER FOIL (RCF) APPLICATION

RCF PATTERNING BY LASER ABLATION

THERMAL CONDUCTIVE PASTE PRINTING

US 8,686,556 B2

WAFER LEVEL APPLIED THERMAL HEAT SINK

CROSS REFERENCE TO RELATED APPLICATIONS

This application claims the benefit of priority of U.S. Provisional Patent Application Ser. No. 61/543,472 filed Oct. 5, 2011, entitled Wafer Level Applied Thermal Heat Sink, the content of which is hereby incorporated by reference in its entirety.

BACKGROUND OF THE DISCLOSURE

1. Field of the Disclosure

The present disclosure generally relates to a structure and method for the creation of on-chip thermal heat sinks for active, passive or discrete integrated circuit applications specifically for the application of embedded die in printed circuit boards.

2. State of the Art

Semiconductor wafers consist of multiple arrays of devices often referred to as chips or die which are later separated into individual discrete devices, a process known as "singulation". After singulation, these chips are further integrated into a chip package and then mounted onto a printed circuit board during final board assembly for the particular end product. A relatively new and upcoming technique is to combine the chip packaging and the printed circuit board assembly with a process of embedding the chip into a printed circuit board.

Assembly of large PWB substrate sizes with multiple embedded die PWB's in a step and repeat format is desirable to improve economy of scale. It is also desirable to increase component density in order to reduce total package footprint.

In many passive, active or discrete semiconductor circuit applications, it is desirable to provide adequate heat sinking of the chip circuitry to ensure optimal chip, and total system performance. Heat sinking allows the chip to perform its function more efficiently at a given power load and allows higher reliability of the chip and the adjacent chip and other devices, since heat generally degrades the performance of most semiconductors.

Typically on-chip heat sinking is achieved by electroplating thick metals with good thermal conductivity, such as copper, or a copper alloy, in the desired hotspot region on the chip. This aids heat dissipation into the surrounding package and ambient environment. This process is typically performed on a semiconductor wafer either at the wafer foundry or at the final wafer level packaging supplier. However, a wafer level process offers significant cost advantages as multiple heat sinks can be created simultaneously in the normal wafer level manufacturing process steps.

Heat sinks can also be placed discretely with post wafer processing on individual singulated devices, chips or die. Typically, on-chip heat sinks are created by electroplated copper processes. However, increasing the plating area or the plating thickness increases process cost. Thus it is desirable to identify a low cost, high volume alternative process for large surface area structures.

Thermal dissipation management by heat-sinking is particularly problematic in the newer embedded chip or die package applications where the chip is encapsulated by the PWB (printed wiring board). Polymeric materials used in the PWB core and subsequent build up layers typically have low thermal conductivity compared to plated metals or applied metal foils. In the embedded chip application, the chip is separated by one or more buildup layers from the external surface of the printed circuit board where air or metal heat sinks can assist in thermal dissipation management. Therefore an embedded chip is susceptible to higher operating temperatures for a given power load.

In the encapsulated embedded chip application, it can also be necessary to provide adequate thermal dissipation to both the front side and back side of the embedded component to assist in removing heat to the surface or sides of the PWB. Thus there is a need for a cost effective wafer level process particularly in the embedded chip or die manufacturing process that incorporates increased heat sink capabilities.

SUMMARY OF THE DISCLOSURE

An embodiment of a process of wafer level chip scale package formation with heat dissipation capability includes: providing an incoming wafer having a back side; applying a resin foil layer to the back side of the wafer; patterning the resin foil layer by laser ablation to form heat sink locations; applying a thermal conductive paste to the back side of the wafer over and on the patterned resin foil layer; and solidifying the thermal conductive paste to form one or more heat sinks on the wafer.

Another embodiment further includes forming a thermal via on one or more of the solidified conductive pastes. The process may also include embedding the wafer level chip scale package in an embedded die package. The process may also include applying an outer layer over the wafer level chip scale package in the embedded die package. The process may also include exposing the heat sink of the wafer level chip scale package through the outer layer. The heat sink may be exposed by a via through the outer layer. An external discrete heat sink may be attached to the wafer level chip scale package heat sink to further enhance heat dissipation.

The conductive paste is preferably a metal paste. The metal paste preferably may be a copper, tin, or a thermally conductive metal alloy. The resin foil layer is preferably a resin copper foil layer.

BRIEF DESCRIPTION OF THE DRAWINGS

The disclosure will be better understood and features and objects of the disclosure, including those set forth above, will become apparent when consideration is given to the following detailed description. Such description makes reference to the accompanying drawings wherein:

FIG. 2A-2E presents a representation of the buildup process of a conventional wafer level chip scale package and a conventional on-chip heat sink shown in FIG. 1.

DETAILED DESCRIPTION

In the following description, numerous specific details are set forth in order to provide a more thorough disclosure. It will be apparent, however, to one skilled in the art, that the art disclosed may be practiced without these specific details. In some instances, well-known features may have not been described in detail so as not to obscure the art disclosed.

Embodiments in accordance with the present disclosure enable enhanced heat sinking. This allows adjacent components to be placed closer together with reduced thermal interaction in embedded PWB (printed wiring board) electronic package applications. Furthermore, this improved heat sinking at chip level can allow for chip shrinkage while maintaining the same chip performance.

Figure 1:
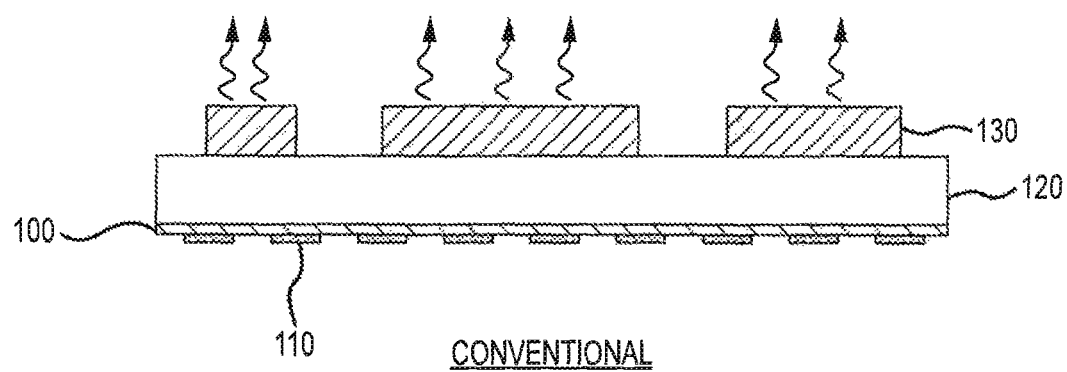
FIG. 1 is a simplified side view of a conventional wafer level chip scale package with discrete components thereon.
Figure 2A:
Figure 2B:
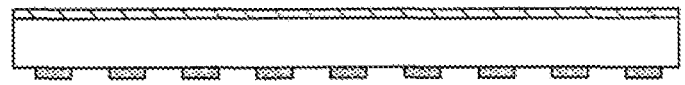
Figure 2C:
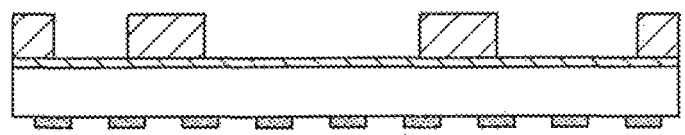
Figure 2D:
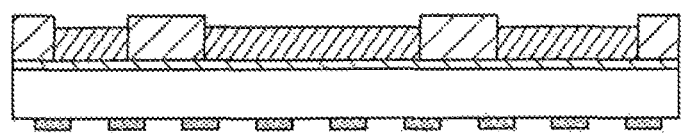

FIG. 1 Illustrates a conventional active, passive or discrete semiconductor chip scale package in cross section. The chip scale package has typical front side circuitry 100 and exposed front side contact pads 110 for electrical interconnection. Excess heat produced by the front side circuitry must be dissipated by conduction through the bulk semiconductor material 120 and then finally dissipated by dedicated heat sink structures 130.

FIG. 2A-2E illustrates the conventional electronic chip scale package buildup process with dedicated heat sink structures formed on the component backside to produce the head sink structures 210 on the package back side. In this case, the final heat sink structure 210 is formed by a typical electroplating process.

FIG. 3A-3D Illustrates wafer level formation of an electronic chip scale package with dedicated heat sink structures formed on the component backside in accordance with the present disclosure.

Figure 3A:
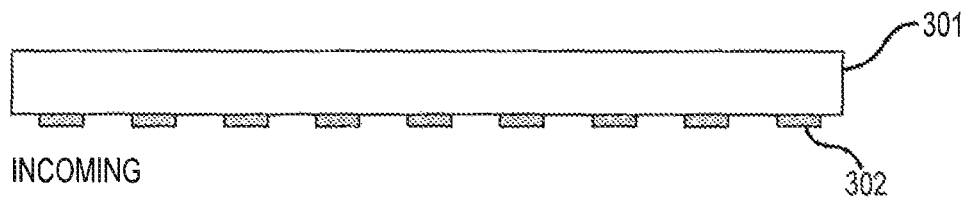
FIG. 3A-3D presents a representation of the wafer level chip scale package format buildup process in accordance with the present disclosure with the wafer level applied heat sink structure formed on the component back side.

In the operation of FIG. 3A, the incoming fabricated wafer level chip scale package is shown prior to separation into discrete chip packages. The chip scale package 301 has contact pads 302 already formed on the front side thereof.

Figure 3B:
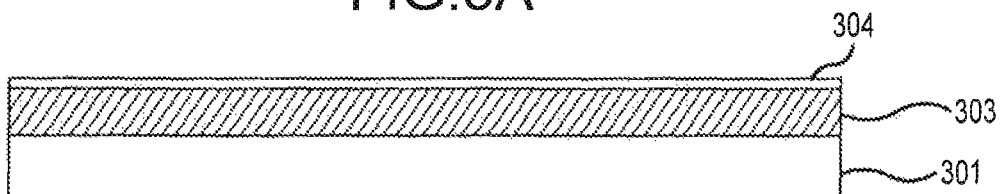

In the operation of FIG. 3B, a resin layer 303 and a copper foil 304 are deposited on the back side of the wafer level chip scale package 301. This composite layer called a resin copper foil (RCF) application layer.

Figure 3C:

In the operation of FIG. 3C, the RCF layer 303, 304 is patterned by laser ablation.

Figure 3D:
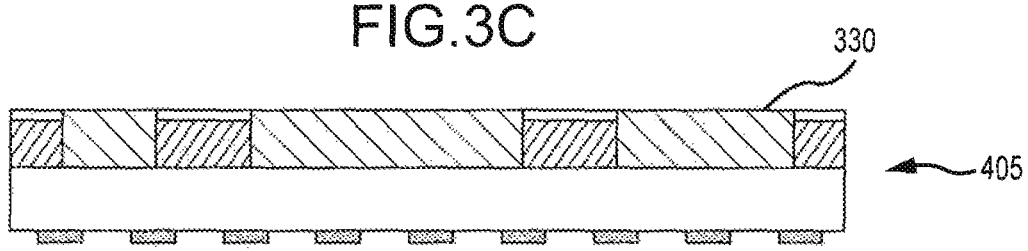

In the operation of FIG. 3D, a copper (Cu) paste is printed between the RCF patterning. This Cu paste hardens and forms the wafer level heat sinks 330 in the finished chip scale package after separation of the wafer into discrete chip scale packages (singulation).

Thus the heat sink structure 330 is formed using a resin copper foil application process. A resin coated copper foil 320 is applied and subsequently etched to define the heat sink features. The copper heat sink is then formed by an application of a copper paste 330 that has an integral binder in the paste that solidifies during a post-cure process and forms a permanent copper heat sink.

The process applied in FIG. 3A-3D may similarly be applied to the front side of the incoming wafer 301/302. Therefore, although not illustrated, the description of the operations 3A through 3D above described applies equally well to the front side of the wafer 301/302.

Figure 4:
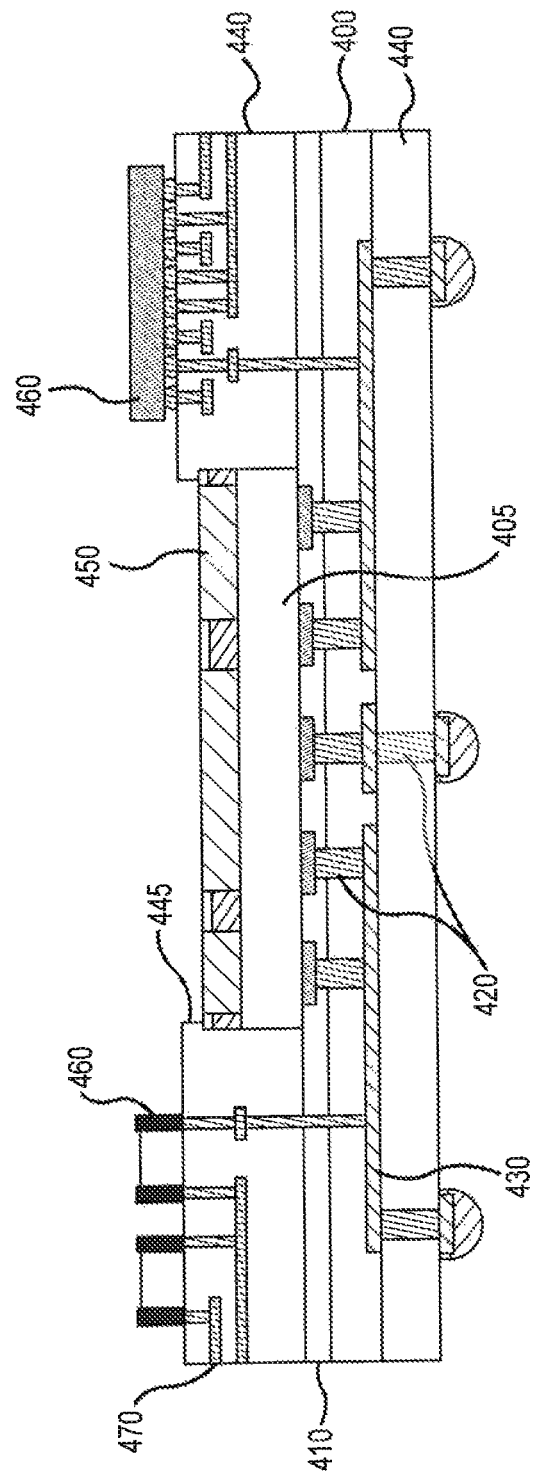
FIG. 4 is a schematic sectional view of the final embedded die package with open surface cavity for ambient thermal dissipation.

FIG. 4 Illustrates a chip scale package 405, formed by the process just described, used in an embedded die package. The chip 405 is mounted onto the PWB core 400 and adhered thereto via a pre-preg adhesive layer 410. Electrical interconnects to the chip scale package 405 through the PWB are formed by means of vias 420 and routings 430.

A typical resin coated copper foil is applied to form the PWB inner and outer layer(s) 440. These layers 440 may include structures to connect components 460 as shown. Cavities 445 in the back side outer layer 440, created by conventional laser ablation, expose the on-chip heat sink regions 450 formed by the process described in FIG. 3a-3d. These exposed heat sink regions 450 aid thermal dissipation to the package environment. The additional surface mountable componentry 460 is mounted to PWB outer surface 440 in a conventional manner. Additional circuitry 470 can be created within the PWB outer layers 440.

Figure 5:
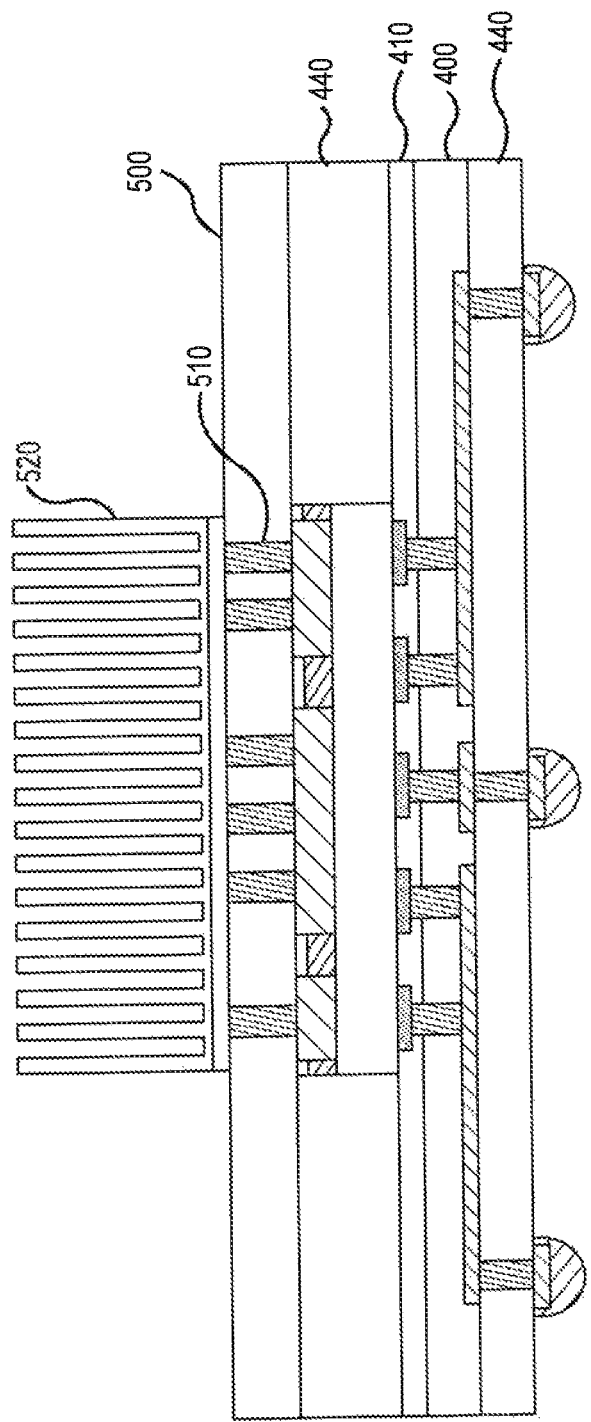
FIG. 5 is a schematic sectional view of the final package shown in FIG. 4 with further vias formed through an overlayer with an additional external heat sink structure installed.

FIG. 5 Illustrates an alternative embedded die package which includes further heat sink capabilities. The chip backside is fully encapsulated by an additional PWB outer layer 500. Copper filled vias 510 have been created in the layer 500 to contact the on-chip thermal heat sinks 450 allowing thermal dissipation through the layer 500 to the surface of the PWB outer layer 500. A optional surface mountable heat sink 520 is connected to the vias 510 for additional heat dissipation.

A method for low cost, high yielding wafer level applied thermal heat sinks is disclosed herein utilizing patterning of resin coated copper foil and copper paste combined with wafer level processing to produce wafer level chip scale packages. The present disclosure provides a means to apply a variety of heat sink designs, thickness and geometries without adding significant process complexity or cost.

The chip in accordance with the present disclosure contains integrated electronic circuitry and pads used for electrical interconnects to a PWB substrate or other external circuitry. Further, the chip contains dedicated heat sink features used for on-chip mass or local thermal dissipation. In particular, the chip contains a resin copper foil layer used in patterning to form the heat sink feature and to assist with surface adhesion in the final packaging format.

Various modifications and alternatives to the disclosed embodiments will be apparent to those skilled in the art. The process described herein is applicable for other than chip scale packages. The process may also be applied to an incoming flipchip package, system-in-package, embedded chip structures, stacked chip packages, and other multi-die, multi-discrete 3D packages. The incoming wafer level package shown in FIG. 3A-3D is merely exemplary. Accordingly, all such alternatives, variations and modifications are intended to be encompassed within the scope of and as defined by the following claims.

What is claimed is:

1. A process of wafer level chip scale package formation with heat dissipation capability comprising:
   providing an incoming wafer having a back side;
   applying a resin foil layer to the back side of the wafer;
   patterning the resin foil layer by laser ablation;
   applying a thermal conductive paste to the back side of the wafer over and on the patterned resin foil layer;
   solidifying the thermal conductive paste into one or more heat sinks on the wafer completing formation of a wafer level chip scale package; and
   embedding the wafer level chip scale package in an embedded die package.

2. The process of claim 1 wherein the thermal conductive paste is a conductive metal paste.

3. The process of claim 2 wherein the metal paste comprises copper, tin, or a thermally conductive metal alloy.

4. The process of claim 1 wherein the resin foil layer is a resin copper foil layer.

5. The process of claim 4 further comprising embedding the wafer level chip scale package in a die package.

6. The process of claim 2 wherein the metal paste is selected from the group consisting of copper, tin and metal alloys.

7. The process of claim 1 further comprising forming a thermal via on one or more of the solidified conductive pastes.

8. The process of claim 1 further comprising applying an outer layer over the wafer level chip scale package in the embedded die package.

9. The process of claim 8 further comprising exposing the heat sink of the wafer level chip scale package through the outer layer.

10. The process of claim 9 wherein the heat sink is exposed by a via through the outer layer.

11. The process of claim 9 further comprising attaching an external discrete heat sink to the wafer level chip scale package heat sink.

12. A process of wafer level chip scale package formation with heat dissipation capability comprising:
- providing an incoming wafer having a back side;
- applying a resin foil layer to the back side of the wafer;
- patterning the resin foil layer by laser ablation;
- applying a thermal conductive paste to the back side of the wafer over and on the patterned resin foil layer;
- solidifying the thermal conductive paste to form one or more heat sinks on the wafer;
- forming a thermal via on one or more of the solidified conductive pastes; and
- embedding the wafer level chip scale package in an embedded die package.

13. The process of claim 12 further comprising applying an outer layer over the wafer level chip scale package in the embedded die package.

14. The process of claim 13 further comprising exposing the heat sink of the wafer level chip scale package through the outer layer.

15. The process of claim 14 wherein the heat sink is exposed by a via through the outer layer.

16. The process of claim 12 further comprising attaching an external discrete heat sink to the wafer level chip scale package heat sink.

* * * * *